United States Patent
Takahashi et al.

(10) Patent No.: US 10,494,710 B1
(45) Date of Patent: Dec. 3, 2019

(54) FILM-FORMING METHOD, PRODUCTION METHOD FOR PRODUCT WITH CERAMIC FILM, AND PRODUCT WITH CERAMIC FILM

(71) Applicant: YAMAHA HATSUDOKI KABUSHIKI KAISHA, Iwata-shi, Shizuoka (JP)

(72) Inventors: Naohisa Takahashi, Shizuoka (JP); Takehiro Uhara, Shizuoka (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 0 days.

(21) Appl. No.: 16/114,525

(22) Filed: Aug. 28, 2018

(51) Int. Cl.
C23C 14/06 (2006.01)
C23C 14/00 (2006.01)

(52) U.S. Cl.
CPC ...... *C23C 14/0676* (2013.01); *C23C 14/0021* (2013.01); *C23C 14/0036* (2013.01); *C23C 14/0057* (2013.01); *C23C 14/0652* (2013.01)

(58) Field of Classification Search
CPC ............ C23C 14/0676; C23C 14/0021; C23C 14/0036; C23C 14/0057; C23C 14/0652
See application file for complete search history.

(56) References Cited

U.S. PATENT DOCUMENTS

| 7,815,983 B2 * | 10/2010 | Iwanaga | C23C 14/0676 349/158 |
| 2014/0008214 A1 | 1/2014 | Chen et al. | |
| 2015/0125375 A1 | 5/2015 | Zhou et al. | |

FOREIGN PATENT DOCUMENTS

| JP | 06-340972 A | 12/1994 |
| JP | 2002-050230 A | 2/2002 |
| JP | 2006-052727 A | 2/2006 |
| JP | 2007-100693 A | 4/2007 |
| JP | 2012-057208 A | 3/2012 |
| JP | 2012-149278 A | 8/2012 |
| JP | 2013-155399 A | 8/2013 |
| JP | 2014-221543 A | 11/2014 |
| JP | 2015-108190 A | 6/2015 |
| JP | 2015-528056 A | 9/2015 |
| JP | 2016-084505 A | 5/2016 |

OTHER PUBLICATIONS

Machine Translation JP2012149278A (Year: 2012).*

* cited by examiner

*Primary Examiner* — Michael A Band
(74) *Attorney, Agent, or Firm* — Keating and Bennett, LLP

(57) ABSTRACT

A film-forming method includes a sputtering step of forming a silicon nitride film or a silicon oxynitride film on a surface of a substrate by a sputtering method. The sputtering step is performed using a silicon-containing target, and using at least a nitrogen gas. The sputtering step is performed in an atmosphere having a water vapor partial pressure of about $1.5 \times 10^{-3}$ Pa or less. A central region of the silicon nitride film or the silicon oxynitride film formed in the sputtering step has a hydrogen content of about 2 atom % or more.

17 Claims, 4 Drawing Sheets

FILM-FORMING METHOD, PRODUCTION METHOD FOR PRODUCT WITH CERAMIC FILM, AND PRODUCT WITH CERAMIC FILM

BACKGROUND OF THE INVENTION

1. Field of the Invention

The present invention relates to a film-forming method, and more particularly, to a film-forming method for forming a silicon nitride film or a silicon oxynitride film as a ceramic film. The present invention also relates to a product with a ceramic film and a production method for a product with a ceramic film.

2. Description of the Related Art

In recent years, applications of a ceramic thin film excellent in heat resistance and insulation property have been expanding. For example, various applications of a silicon-containing ceramic film have been proposed.

In Japanese Patent Application Laid-open No. 2012-57208, there is disclosed an elastic boundary wave device using a silicon oxynitride film as one of its medium layers. In addition, in Japanese Patent Application Laid-open No. 2006-52727 and Japanese Patent Application Laid-open No. 2007-100693, there are disclosed an exhaust pipe for an internal combustion engine having a silicon nitride film, a silicon oxynitride film, or the like formed on a surface thereof.

SUMMARY OF THE INVENTION

The inventors of preferred embodiments of the present invention have made various investigations on film quality of a silicon-containing ceramic film, and as a result, have discovered that not only a compositional ratio, but also various conditions at a time of film formation may significantly influence the film quality. That is, the inventors have discovered that the silicon-containing ceramic film has room for further improvement in film quality.

Preferred embodiments of the present invention provide film-forming methods that improve the film quality of a silicon-containing ceramic film.

According to a preferred embodiment of the present invention, a film-forming method includes a sputtering step of forming a silicon nitride film or a silicon oxynitride film on a surface of a substrate by a sputtering method, the sputtering step being performed using a silicon-containing target as a target and at least a nitrogen gas as a reactive gas, the sputtering step being performed in an atmosphere having a water vapor partial pressure of about $1.5 \times 10^{-3}$ Pa or less, for example, a central region of the silicon nitride film or the silicon oxynitride film formed in the sputtering step having a hydrogen content of about 2 atom % or more, for example, the central region collectively referring to a region extending from a center in a film thickness direction toward a first surface of the film for about 10% of a film thickness and a region extending from the center in the film thickness direction toward a second surface of the film for about 10% of the film thickness.

According to a preferred embodiment of the present invention, the hydrogen content of the central region is about 20 atom % or less, for example.

According to a preferred embodiment of the present invention, the central region has an oxygen content of about 3 atom % or more and about 20 atom % or less, for example.

According to a preferred embodiment of the present invention, the central region has a nitrogen content of about 20 atom % or more and about 60 atom % or less, for example.

According to a preferred embodiment of the present invention, the central region has a silicon content of about 20 atom % or more and about 50 atom % or less, for example.

According to a preferred embodiment of the present invention, the substrate has a temperature of about 100° C. or less, for example, during the sputtering step.

According to a preferred embodiment of the present invention, the substrate has a temperature of about 80° C. or less, for example, during the sputtering step.

According to a preferred embodiment of the present invention, the substrate has a temperature of about 60° C. or less, for example, during the sputtering step.

According to a preferred embodiment of the present invention, the water vapor partial pressure of the atmosphere during the sputtering step is about $1.0 \times 10^{-3}$ Pa or less, for example.

According to a preferred embodiment of the present invention, the sputtering step is performed in an atmosphere having a total pressure of about $3.0 \times 10^{-2}$ Pa or more and about 1.0 Pa or less, for example.

According to a preferred embodiment of the present invention, a ratio of the water vapor partial pressure to a total pressure of the atmosphere during the sputtering step is about 0.02 or less, for example.

According to a preferred embodiment of the present invention, a ratio of the water vapor partial pressure to a total pressure of the atmosphere during the sputtering step is about 0.01 or less, for example.

According to a preferred embodiment of the present invention, an input power density during the sputtering step, which is input power per unit area supplied to the target, is about 1.0 W/cm$^2$ or more, for example.

According to a preferred embodiment of the present invention, the input power density during the sputtering step is about 2.0 W/cm$^2$ or more, for example.

According to a preferred embodiment of the present invention, the target is supplied with input power from a DC power source or a DC pulse power source.

According to a preferred embodiment of the present invention, the silicon nitride film or the silicon oxynitride film has a thickness of about 5 nm or more and about 30 nm or less, for example, and the silicon nitride film or the silicon oxynitride film is substantially colorless and substantially transparent.

According to a preferred embodiment of the present invention, the thickness of the silicon nitride film or the silicon oxynitride film is about 10 nm or more and about 20 nm or less, for example.

According to a preferred embodiment of the present invention, a production method for a product with a ceramic film includes the steps of preparing a substrate, and forming a silicon nitride film or a silicon oxynitride film on a surface of the substrate as a ceramic film according to the film-forming method described above.

According to a preferred embodiment of the present invention, a product with a ceramic film produced by the production method described above.

According to a preferred embodiment of the present invention, the sputtering step of forming a silicon nitride film or a silicon oxynitride film by a sputtering method includes using the silicon-containing target as the target, and at least the nitrogen gas as the reactive gas. By virtue of the atmosphere in the sputtering step having a water vapor partial pressure of about $1.5 \times 10^{-3}$ Pa or less, for example, and the central region of the silicon nitride film or the silicon oxynitride film having a hydrogen content of about 2 atom % or more, for example, the film quality of the ceramic film is improved.

The hydrogen content of the central region is preferably about 20 atom % or less, for example. When the hydrogen content is excessively high, there is a risk that water resistance may be reduced.

The central region preferably has an oxygen content of, for example, about 3 atom % or more and about 20 atom % or less.

The central region preferably has a nitrogen content of, for example, about 20 atom % or more and about 60 atom % or less.

The central region preferably has a silicon content of, for example, about 20 atom % or more and about 50 atom % or less.

The temperature of the atmosphere in a chamber during the sputtering step is preferably about 100° C. or less, for example. When the temperature of the atmosphere in the chamber is about 100° C. or less, almost no cooling time is required after film formation, and hence a further improvement in productivity is achieved.

From the viewpoint of improving the productivity, the temperature of the atmosphere in the chamber during the sputtering step is more preferably about 80° C. or less, still more preferably about 60° C. or less, for example.

When the water vapor partial pressure of the atmosphere during the sputtering step is about $1.0 \times 10^{-3}$ Pa or less, for example, the film quality of the ceramic film is further improved.

The total pressure of the atmosphere during the sputtering step is preferably about $3.0 \times 10^{-2}$ Pa or more, for example, from the viewpoint of providing a stable electric discharge, and is preferably about 1.0 Pa or less, for example, from the viewpoint of the film quality.

From the viewpoint of achieving a further improvement in film quality of the ceramic film, the ratio of the water vapor partial pressure to the total pressure of the atmosphere during the sputtering step is preferably about 0.02 or less, more preferably about 0.01 or less, for example.

When the input power density during the sputtering step is about 1.0 W/cm$^2$ or more, for example, the film quality of the ceramic film is further improved.

When the input power density during the sputtering step is about 2.0 W/cm$^2$ or more, for example, the film quality of the ceramic film is still further improved.

When the target is supplied with input power from a DC power source or a DC pulse power source, that is, when the sputtering is performed using a DC power source or a DC pulse power source, a film formation time is shortened as compared o a case in which the sputtering is performed using an AC power source.

When the thickness of the silicon nitride film or the silicon oxynitride film is about 5 nm or more and about 30 nm or less (preferably about 10 nm or more and about 20 nm or less), a colorless and transparent ceramic film in which an interference color does not occur is obtained.

According to various preferred embodiments of the present invention, the film-forming methods improve the film quality of a silicon-containing ceramic film.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, with reference to the attached drawings, film-forming methods and production methods for a product with a ceramic film according to preferred embodiments of the present invention are described. The present invention is not limited to the following preferred embodiments.

Figure 1:
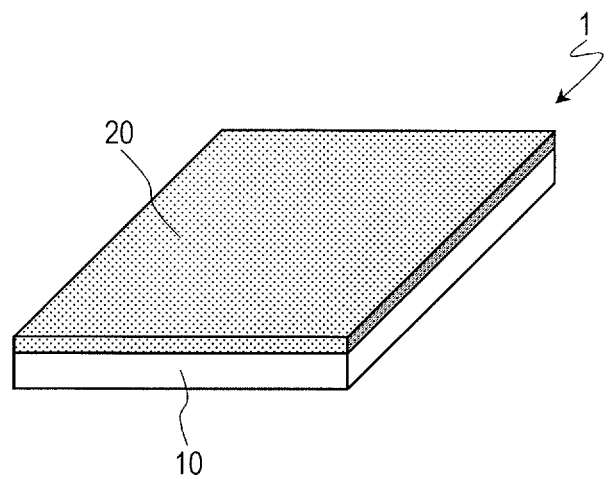
FIG. 1 is a perspective view for schematically illustrating a product 1 with a ceramic film to be produced using a production method according to a preferred embodiment of the present invention.

FIG. 1 is an illustration of a product 1 with a ceramic film (hereinafter referred to simply as "product 1") to be produced by a production method according to a preferred embodiment of the present invention. As illustrated in FIG. 1, the product 1 includes a substrate 10 and a ceramic film 20 formed on the surface of the substrate 10.

The substrate 10 is, for example, a metal material. As the metal material, for example, magnesium, aluminum, titanium, copper, alloys thereof, and stainless steel may be used. The material for the substrate 10 is not limited to the metal material. The substrate 10 may be a resin material or a glass material. As the resin material, for example, polyethylene terephthalate (PET) and cyclic polyolefin (COP) may be used.

Figure 2:
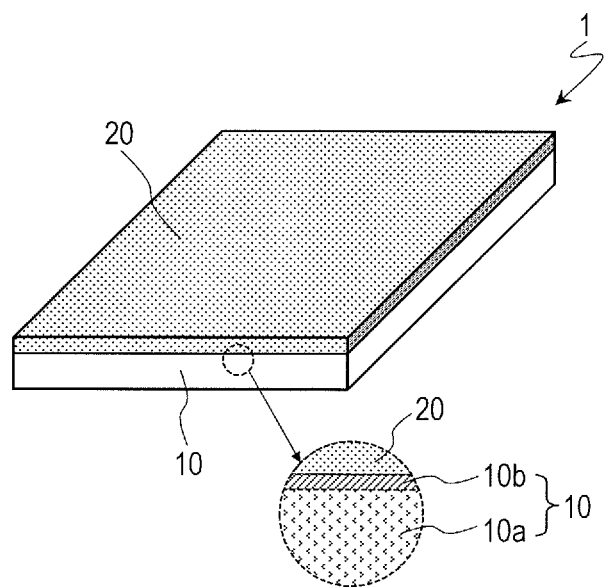
FIG. 2 is a view for illustrating an example of another configuration of the product 1 with a ceramic film.

The substrate 10 may have a laminated structure including a plurality of layers made of materials different from each other. For example, as illustrated in FIG. 2, the substrate 10 may include a base layer 10a and a plating layer 10b on the base layer 10a. The plating layer 10b is a metal material (e.g., chromium or nickel) applied using a plating method, for example. The base layer 10a is a material different from that for the plating layer 10b. The material for the base layer 10a may be a metal material, or may be a material other than a metal material.

Although the substrate 10 preferably is plate-shaped as illustrated in FIG. 1, the shape of the substrate 10 is not limited to the one exemplified in FIG. 1. The substrate 10 may have various shapes. The surface of the substrate 10 does not necessarily need to be planar, and may include a curved portion.

The ceramic film 20 includes silicon and nitrogen. That is, the ceramic film 20 is a silicon nitride ($SiN_y$, where y is a non-integer or an integer) film or a silicon oxynitride ($Si-O_xN_y$, where x and y are each independently a non-integer or an integer) film. The ceramic film 20 is typically provided on the surface of the substrate 10 directly, that is, without an intervening layer. As described below, when the ceramic film 20 needs to be substantially colorless and substantially transparent (e.g., when the ceramic film 20 is used for an optical film or the like), the thickness of the ceramic film 20 is set to, for example, about 5 nm or more and about 30 nm or less (preferably about 10 nm or more and about 20 nm or less).

The ceramic film 20 does not necessarily need to be provided over the entire surface of the substrate 10. The ceramic film 20 may be provided only on a portion of the surface of the substrate 10.

A production method for the product 1 includes the steps of preparing the substrate 10, and forming the ceramic film 20 on the surface of the substrate 10. Now, a method of forming the ceramic film 20 on the surface of the substrate 10, that is, a film-forming method for the ceramic film 20 is described.

A film-forming method according to a preferred embodiment of the present invention includes a sputtering step of forming the ceramic film 20 on the surface of the substrate 10 by a sputtering method. During the sputtering step, a silicon-containing target is used as a target. In addition, during the sputtering step, at least a nitrogen gas is used as a reactive gas.

The water vapor partial pressure of an atmosphere in the sputtering step is set within a predetermined range. The water vapor partial pressure is, for example, about $1.5 \times 10^{-3}$ Pa or less.

Figure 3:
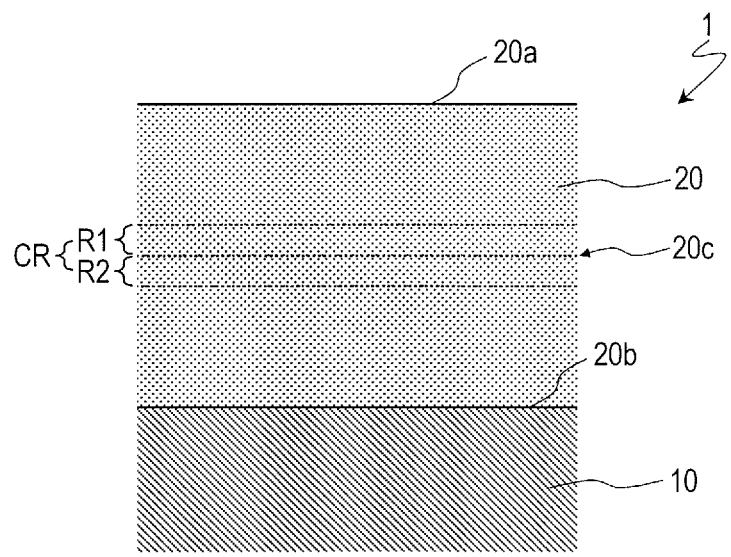
FIG. 3 is a cross-sectional view for illustrating the vicinity of a ceramic film 20 of the product 1.

In addition, the hydrogen content of the ceramic film 20 to be formed in the sputtering step is set within a predetermined range. This point is described in more detail below with reference to FIG. 3. FIG. 3 is a cross-sectional view for illustrating the vicinity of the ceramic film 20 of the product 1.

Herein, a region R1 of the ceramic film 20 extending from a center 20c in a film thickness direction toward a first shallower side (i.e., a front surface 20a side of the ceramic film 20) for about 10% of a film thickness, and a region R2 of the ceramic film 20 extending from the center 20c in the film thickness direction toward a second deeper side (i.e., a back surface 20b side of the ceramic film 20) for about 10% of the film thickness are collectively referred to as central region CR. In the ceramic film 20 in this preferred embodiment, the central region CR has a hydrogen content of about 2 atom % or more (preferably about 20% or less).

Here, when a film depth at the front surface 20a of the ceramic film 20 after film formation is defined as "0" and a film depth at the surface of the substrate 10 before film formation is defined as "100", the center 20c of the ceramic film 20 is a portion at a film depth of "50" and the central region CR is a region at film depths of "40 or more and 60 or less".

In addition, the "film thickness" of the ceramic film 20 may be a set film thickness during film formation or a difference between the thickness of the product 1 after film formation and the thickness of the substrate 10 before film formation (i.e., an increase in thickness caused by film formation) when the film thickness is controlled. When the film thickness is not controlled, the film thickness may be identified by performing composition analysis from the surface of the product 1 in its depth direction, and presuming that a boundary portion at which the composition greatly changes is the surface of the substrate 10.

As described above, during the sputtering step of the film-forming method according to a preferred embodiment of the present invention, the silicon-containing target is used as the target, and at least the nitrogen gas is used as the reactive gas. According to a detailed investigation made by the inventors of the preferred embodiments of the present invention, it has been discovered that, during such film-forming method, the water vapor partial pressure of the atmosphere during the sputtering step and the hydrogen content of the ceramic film 20 particularly significantly influence the film quality of the ceramic film 20. More specifically, as described in detail below with respect to the test results, it has been discovered that, when the water vapor partial pressure of the atmosphere in the sputtering step is about $1.5 \times 10^{-3}$ Pa or less, for example, and the hydrogen content of the central region CR of the ceramic film 20 is about 2 atom % or more, for example, the film quality of the ceramic film 20 is improved.

Figure 4:
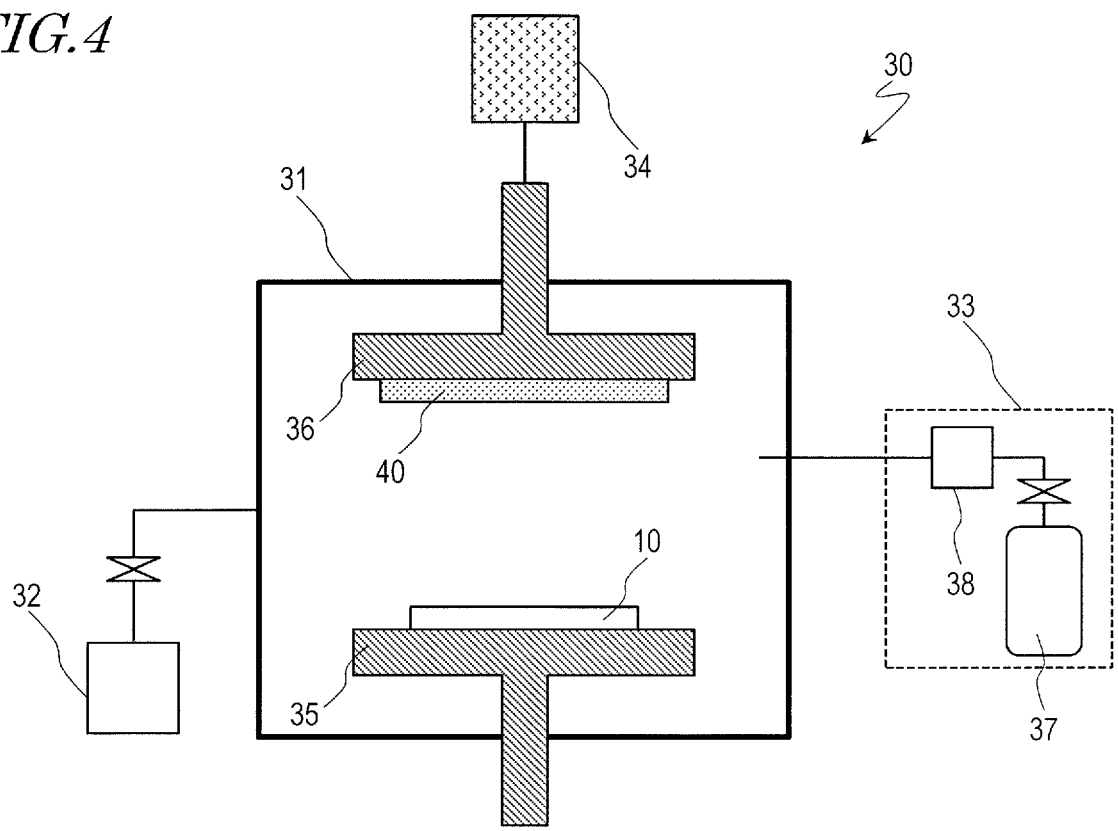
FIG. 4 is a view for schematically illustrating a sputtering apparatus 30 to be used in a film-forming method according to a preferred embodiment of the present invention.

FIG. 4 is an illustration of an example of a sputtering apparatus 30 to be used in the film-forming method according to a preferred embodiment of the present invention. As illustrated in FIG. 4, the sputtering apparatus 30 includes a chamber (also called a "vacuum chamber") 31, a vacuum exhaust device 32, a gas supply device 33, and a power source 34.

In the chamber 31, a support 35 and a cathode 36 are provided. The substrate 10 is placed on the support 35. The support 35 defines and functions as an anode. A target 40 is mounted to the cathode 36 so as to be opposed to the substrate 10.

The vacuum exhaust device 32 includes at least one pump. Using the vacuum exhaust device 32, the inside of the chamber 31 is kept at a predetermined degree of vacuum.

The gas supply device 33 supplies a gas to the inside of the chamber 31 at a desired flow rate. The gas supply device 33 includes, for example, a cylinder 37 and a mass flow controller 38. In the cylinder 37, a gas to be used for sputtering is stored. The gas to be used for sputtering is a reactive gas and/or a non-reactive gas. The mass flow controller 38 detects and controls the gas flow rate.

The power source 34 is connected to the cathode 36, and applies a voltage to the target 40 via the cathode 36. The power source 34 supplies input power to the target 40. As the power source 34, an AC power source may be used, or as described below, a DC power source or a DC pulse power source may be used.

With the sputtering apparatus 30 as described above, the film-forming method is suitably carried out. The structure of the sputtering apparatus 30 is not limited to the one exemplified in FIG. 4. For example, when a magnetron sputtering method to be described below is used as the sputtering method, a magnetron cathode including a magnetic field generator is used as the cathode 36. In addition, in FIG. 4, an example in which one substrate 10 and one target 40 are provided in the chamber 31 is illustrated in order to simplify description. However, a plurality of the substrates 10 may be provided, and a plurality of the targets 40 may be provided.

Next, an example of a film-forming method according to a preferred embodiment of the present invention is described.

The water vapor partial pressure of the atmosphere in the sputtering step is preferably about $1.0 \times 10^{-3}$ Pa or less, for example. When the water vapor partial pressure is about $1.0 \times 10^{-3}$ Pa or less, the film quality of the ceramic film 20 is still further improved.

The water vapor partial pressure of the atmosphere in the sputtering step may be controlled by, for example, adjusting an vacuum pumping time and/or an vacuum pumping speed during a step of vacuum pumping the inside of the chamber 31 (vacuum pumping step), which is performed prior to the sputtering step. As the vacuum pumping time is lengthened or as the vacuum pumping speed is increased, the water vapor partial pressure is lowered. Alternatively, the water vapor partial pressure may also be lowered by enhancing the performance of the pump to be included in the vacuum exhaust device 32 or providing a moisture trapping mechanism in the chamber 31. In addition, the water vapor partial pressure may be suitably lowered by providing a heater in the chamber 31 or mounting a heater to the outer wall of the chamber 31, and heating the inside of the chamber 31 with the heater during the vacuum pumping step. Alternatively, when the humidity in the air is lowered as much as possible (preferably to about 40% or less) at the time of opening of the chamber 31 to the air, water vapor to be adsorbed onto the inner wall of the chamber 31 is reduced, and hence the water vapor partial pressure is also suitably lowered. When the water vapor partial pressure is excessively lowered, there is a risk that productivity may be reduced due to, for example, excessive lengthening of the vacuum pumping time. Therefore, from the viewpoint of productivity, the water vapor partial pressure of the atmosphere in the sputtering step is preferably about $1.0 \times 10^{-5}$ Pa or more, more preferably about $1.0 \times 10^{-4}$ Pa or more.

The total pressure of the atmosphere during the sputtering step (pressure in the chamber 31) is preferably about $3.0 \times 10^{-2}$ Pa or more from the viewpoint of providing a stable electric discharge. In addition, when the nitrogen content in the ceramic film 20 is excessively high, the ceramic film 20 may be reduced in denseness or may be difficult to make colorless. Therefore, from the viewpoint of the film quality, the total pressure of the atmosphere in the sputtering step is preferably about 1.0 Pa or less.

From the viewpoint of achieving a further improvement in the film quality of the ceramic film 20, the ratio of the water vapor partial pressure to the total pressure of the atmosphere in the sputtering step is preferably about 0.02 or less, more preferably about 0.01 or less, for example.

In addition, according to an investigation performed by the inventors of the preferred embodiments of the present invention, it has been discovered that an input power density during the sputtering step also significantly influences the film quality of the ceramic film 20. The "input power density" is input power per unit area supplied to the target. More specifically, it has been discovered that, when the input power density is about 1.0 W/cm$^2$ or more, the ceramic film 20 has an excellent film quality. That is, when the input power density in the sputtering step is about 1.0 W/cm$^2$ or more, the film quality of the ceramic film 20 is improved.

The input power density during the sputtering step is more preferably about 2.0 W/cm$^2$ or more. When the input power density is about 2.0 W/cm$^2$ or more, the film quality of the ceramic film 20 is still further improved.

The upper limit of the input power density is not particularly limited, but the input power density is typically about 100 W/cm$^2$ or less, for example.

When the target 40 is supplied with input power from a DC power source, that is, when the sputtering is performed using a DC power source, a film formation time is shortened as compared to a case in which the sputtering is performed using an AC power source.

From the viewpoint of achieving a further improvement in the film quality of the ceramic film 20, a DC current from the DC power source preferably has a magnitude equal to or higher than a predetermined value. Specifically, the DC current from the DC power source is preferably about 3 A or more, more preferably about 5 A or more, for example.

During the sputtering step, an oxygen gas may be introduced in addition to the nitrogen gas into the chamber 31 accommodating the substrate 10 and the target 40. With this addition, a silicon oxynitride film is suitably formed as the ceramic film 20. During the sputtering step, the oxygen gas does not necessarily need to be introduced into the chamber 31. The silicon oxynitride film may also be formed by appropriately adjusting the degree of vacuum pumping prior to the sputtering, and using the oxygen remaining in the chamber 31. Even when the degree of vacuum pumping is adjusted so that the silicon oxynitride film is formed using the remaining oxygen, the water vapor partial pressure is sufficiently lowered by, for example, reducing, in advance, the amount of water vapor to be adsorbed onto the inner wall of the chamber 31 as described above.

The surface area of the target 40 is preferably about 1,000 cm$^2$ or more, more preferably about 1,500 cm$^2$ or more, for example. As the surface area of the target 40 increases, Si ions to be sputtered from the surface of the target 40 are diffused more widely.

A target made of silicon may be suitably used as the target 40. In addition, when a silicon oxynitride film is formed as the ceramic film 20, a target made of silicon oxide may be used as the target 40.

For example, a magnetron sputtering method may be suitably used as the sputtering method. In the magnetron sputtering method, a magnetic field is applied to the surface of the target 40 to generate high-density plasma around the target 40. When the magnetron sputtering method is used, the target 40 is uniformly consumed. In addition, the number of ions that impinge on the target 40 is increased, and hence an improvement in the film formation rate is achieved. Of course, the sputtering method is not limited to the magnetron sputtering method. A sputtering method that does not involve the application of a magnetic field may be used.

In addition, a reverse sputtering step may be performed before the sputtering step. During the reverse sputtering step, a bias voltage is applied to cause plasma particles (e.g., Ar plasma particles) to impinge on the surface of the substrate 10, to thus remove a natural oxide film formed on the surface of the substrate 10. When such reverse sputtering step is performed, adhesiveness between the substrate 10 and the ceramic film 20 is enhanced. The reverse sputtering step does not necessarily need to be performed. Depending on decorativeness required of the product 1, the material for the substrate 10, and the like, it may be better not to perform the reverse sputtering step.

In addition, a pre-sputtering step may be performed before the sputtering step. In the pre-sputtering step, the surface of the target 40 is cleaned by sputtering the surface of the target 40 without depositing sputtered particles on the substrate 10. When the pre-sputtering step is performed, the film quality of the ceramic film 20 and the reproducibility of its film thickness is improved. When the reverse sputtering step is performed, the pre-sputtering is performed after the reverse sputtering step and before the sputtering step. In addition, the pre-sputtering step may be omitted.

The temperature of the atmosphere in the chamber in the series of film-forming steps including the sputtering step is preferably about 100° C. or less, for example. When film formation is performed at a temperature of the atmosphere in the chamber of about 100° C. or less, almost no cooling time is required after film formation, and hence a further improvement in productivity is achieved. In the film-forming method according to a preferred embodiment of the present invention, a heating step for reaction activation is not required, and besides, a temperature rise due to the heat of reaction does not occur. From the viewpoint of improving the productivity, the temperature of the atmosphere in the chamber in the sputtering step is more preferably about 80° C. or less, still more preferably about 60° C. or less, for example. Herein, the film-forming steps also include the reverse sputtering step and the pre-sputtering step when these steps are performed.

Now, preferred examples of the ceramic film 20 and the substrate 10 are described.

The thickness of the ceramic film 20 is preferably about 5 nm or more and about 300 nm or less. When the thickness is less than about 5 nm, it may be difficult to form the ceramic film 20 that uniformly covers the substrate 10. In addition, sufficient gas barrier properties cannot be secured, and hence it may be difficult to completely prevent oxidation and discoloration of the surface of the substrate 10. Meanwhile, a thickness of more than about 300 nm lengthens the period of time required for the formation of the ceramic film 20, reducing the productivity, and hence is not preferred. In addition, when the thickness is more than about 300 nm, or when the ceramic film 20 does not have a completely uniform thickness, an interference color, such as rainbow colors, is liable to be observed, and hence the decorativeness of external appearance may be reduced. In addition, when the thickness is more than about 300 nm, physical properties obtained in a thin film are reduced to physical properties close to those of a bulk (e.g., plastic elongation is reduced from about 1.0% or more to less than about 0.5%), and hence there is a risk in that the ceramic film 20 may crack when deformed. From the viewpoint of productivity, the thickness of the ceramic film 20 is preferably about 50 nm or less, more preferably about 40 nm or less. When the thickness of the ceramic film 20 is about 5 nm or more and about 30 nm or less (preferably about 10 nm or more and about 20 nm or less), a colorless and transparent ceramic film 20 in which an interference color does not occur is obtained.

In order to verify the influences of the water vapor partial pressure and total pressure of the atmosphere during the sputtering step on the film quality of a ceramic film, the inventors of the present invention formed ceramic films on the surfaces of substrates under various conditions, and performed a high-temperature heating test to evaluate the film quality of each of the ceramic films. The results are described below.

Figure 5:
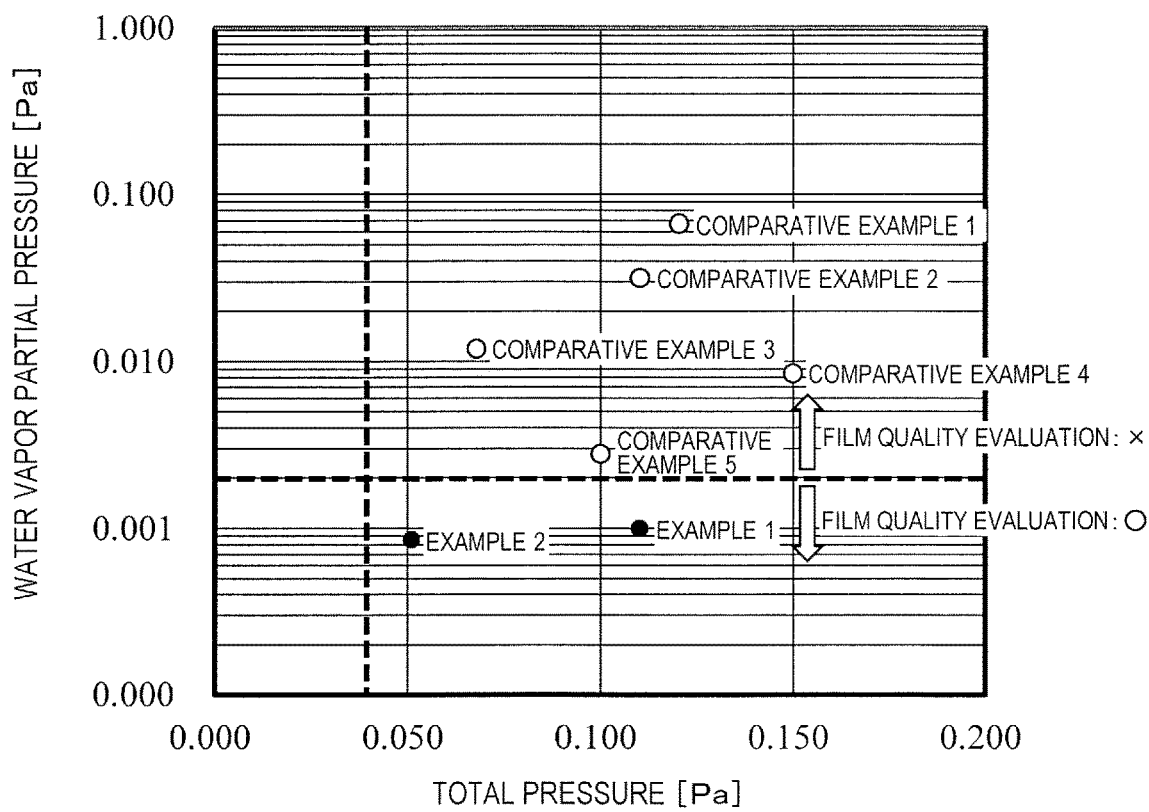
FIG. 5 is a graph for showing a water vapor partial pressure [Pa] and a total pressure [Pa] during a sputtering step, together with the results of film quality evaluation, for ceramic films of Examples 1 and 2, and Comparative Examples 1 to 5.

In order to perform the testing, silicon oxynitride films were formed as ceramic films in Examples 1 and 2, and Comparative Examples 1 to 5. In Table 1 below, for each of Examples 1 and 2, and Comparative Examples 1 to 5, the film formation conditions and the result of the high-temperature heating test (result of film quality evaluation) are shown. In Table 1, the total pressure [Pa] and water vapor partial pressure [Pa] of the atmosphere, and the ratio of the water vapor partial pressure to the total pressure are shown as the film formation conditions. In addition, the substrate and the thickness of the ceramic film to be formed (set film thickness) are also shown. In addition, the results of the film quality evaluation for Examples 1 and 2, and Comparative Examples 1 to 5 are also shown in FIG. 5.

The high-temperature heating test was performed by leaving the substrate having the ceramic film formed on its surface to stand in the air at a predetermined temperature (unless otherwise stated, 500° C.) for 24 hours; and investigating discoloration on the surface. Specifically, a color difference $\Delta E^*$ in the $L^*a^*b^*$ color system was measured, and the state of discoloration was evaluated in two stages by marking, with Symbol "○", a case in which the color difference $\Delta E^*$ between before and after heating was 3 or less and marking, with Symbol "x", a case in which the color difference $\Delta E^*$ between before and after heating was more than 3. In each of Examples 1 and 2, and Comparative Examples 1 to 5, a magnetron sputtering method was used as a sputtering method, and the temperature of the substrate in the sputtering step was room temperature. In addition, a DC power source was used as a power source.

TABLE 1

| | Substrate | Set film thickness [nm] | Total pressure [Pa] | Water vapor partial pressure [Pa] | Water vapor partial pressure/total pressure | Result of high-temperature heating test |
|---|---|---|---|---|---|---|
| Comparative Example 1 | SUS304 | 20 | 0.12 | 0.067 | 0.56 | x |
| Comparative Example 2 | SUS304 | 20 | 0.11 | 0.032 | 0.29 | x |
| Comparative Example 3 | SUS304 | 20 | 0.07 | 0.012 | 0.18 | x |
| Comparative Example 4 | SUS304 | 20 | 0.15 | 0.009 | 0.06 | x |
| Comparative Example 5 | SUS304 | 20 | 0.10 | 0.003 | 0.03 | x |
| Example 1 | SUS304 | 20 | 0.11 | 0.001 | 0.01 | ○ |
| Example 2 | SUS304 | 20 | 0.05 | 0.001 | 0.02 | ○ |

As shown in Table 1 and FIG. 5, Examples 1 and 2, in each of which the water vapor partial pressure was $1.5 \times 10^{-3}$ Pa or less, the film quality of the ceramic film was excellent (the evaluation result was "○"). In contrast, in each of Comparative Examples 1 to 5, the film quality of the ceramic film was inferior to those of Examples 1 and 2 (the evaluation result was "x").

Thus, it has been confirmed that, when the water vapor partial pressure during the sputtering step is $1.5 \times 10^{-3}$ Pa or less, the film quality of the ceramic film is improved. In addition, it was also discovered from the results shown in Table 1 that the ratio of the water vapor partial pressure to the total pressure is preferably 0.02 or less.

In each of Examples 1 and 2, the obtained ceramic film was amorphous. It is considered that the fact that the ceramic film is amorphous also greatly contributes to the satisfactory film quality (heat resistance of 500° C. or more).

In addition, in each of Examples 1 and 2, the input power density in the sputtering step was 1.0 W/cm² or more. The testing performed by the inventors of the preferred embodiments of the present invention has confirmed that, when the input power density is 1.0 W/cm² or more, the film quality tends to be satisfactory (the color difference $\Delta E^*$ in the heating evaluation test tends to be smaller) than in the case where the input power density is less than 1.0 W/cm². In addition, it has also been confirmed that, when the input power density is 2.0 W/cm² or more, the film quality is further improved.

Sputtering using a DC power source (DC sputtering) is generally difficult to perform with an insulating target. However, when the input power density is set to 1.0 W/cm² or more (preferably set to 2.0 W/cm² or more), the DC sputtering with an insulating target is suitably performed. Herein, the "insulating target" encompasses a silicon target substantially free of doping with impurities, and has an electrical resistivity of, for example, about $1.0 \times 10^3$ Ωm or more.

The power source may be a DC pulse power source which supplies a pulsed (intermittent) DC current. When the pulsed DC current is used, it is preferred that a pulsed current of the opposite polarity (reverse pulse) be not used in combination therewith (i.e., the reverse pulse be not output from the DC pulse power source) or that the reverse pulse be short and low. This is because, when the reverse pulse is output, a treatment time is lengthened accordingly, and hence a period of time for which a workpiece is exposed to plasma is lengthened, to cause a rise in workpiece temperature.

Now, the results of composition analysis of the ceramic film 20, which has been confirmed to be excellent in film quality by the testing, in its thickness direction are described. First, composition analysis of the ceramic film 20 formed under film formation conditions shown in Table 2 (Example 3) was performed by a Rutherford backscattering spectrometry (RBS) method.

TABLE 2

| | Substrate | Set film thickness [nm] | Total pressure [Pa] | Water vapor partial pressure [Pa] | Water vapor partial pressure/ total pressure | Result of high-temperature heating test |
|---|---|---|---|---|---|---|
| Example 3 | Si | 22 | 0.0513 | 0.00093 | 0.0181 | ○ |

Figure 6:
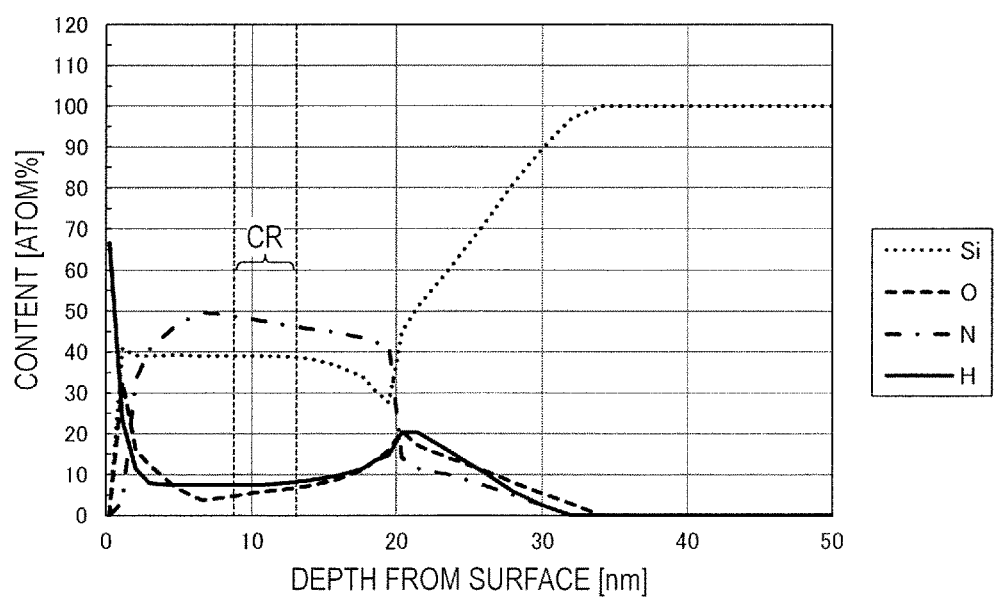
FIG. 6 is a graph for showing the results of composition analysis of a ceramic film of Example 3 performed by a Rutherford backscattering spectrometry (RBS) method.

The results of the composition analysis performed by the RBS method are shown in Table 3 and FIG. 6.

TABLE 3

Example 3

| Depth from surface [nm] | Silicon content [atom %] | Oxygen content [atom %] | Nitrogen content [atom %] | Hydrogen content [atom %] |
|---|---|---|---|---|
| 1.12 | 41.0 | 32.6 | 3.26 | 23.1 |
| 2.04 | 39.1 | 16.1 | 33.3 | 11.5 |
| 2.95 | 39.1 | 12.4 | 40.6 | 7.89 |
| 4.79 | 39.2 | 6.83 | 46.5 | 7.44 |
| 6.63 | 39.1 | 3.70 | 49.8 | 7.44 |
| 8.46 | 39.0 | 4.58 | 48.9 | 7.44 |
| 10.3 | 39.0 | 5.64 | 47.9 | 7.44 |
| 12.1 | 39.0 | 6.35 | 46.8 | 7.88 |
| 14.0 | 38.4 | 7.30 | 45.7 | 8.56 |
| 15.8 | 36.8 | 8.66 | 44.8 | 9.70 |
| 17.6 | 34.0 | 11.0 | 43.6 | 11.4 |
| 18.6 | 30.4 | 13.6 | 42.4 | 13.6 |
| 19.5 | 27.6 | 16.0 | 41.6 | 14.8 |
| 20.4 | 45.0 | 20.6 | 14.1 | 20.3 |
| 21.5 | 51.3 | 17.0 | 11.4 | 20.3 |
| 23.7 | 60.4 | 14.0 | 9.94 | 15.6 |
| 25.9 | 70.5 | 11.2 | 7.52 | 10.8 |
| 27.9 | 80.9 | 8.12 | 5.03 | 5.98 |
| 30.0 | 89.6 | 5.42 | 2.46 | 2.49 |

In the ceramic film 20 of Example 3, the central region CR is a region at depths of from 8.8 nm to 13.2 nm from the surface. As apparent from Table 3 and FIG. 6, the central region CR has a hydrogen content of 2 atom % or more and 20 atom % or less.

Next, composition analysis of the ceramic film 20 formed under film formation conditions shown in Table 4 (Example 4) was performed by an X-ray photoelectron spectroscopy (XPS) method.

TABLE 4

| | Substrate | Set film thickness [nm] | Total pressure [Pa] | Water vapor partial pressure [Pa] | Water vapor partial pressure/ total pressure | Result of high-temperature heating test |
|---|---|---|---|---|---|---|
| Example 4 | SUS304 | 82 | 0.0514 | 0.00098 | 0.0191 | ○ |

Figure 7:
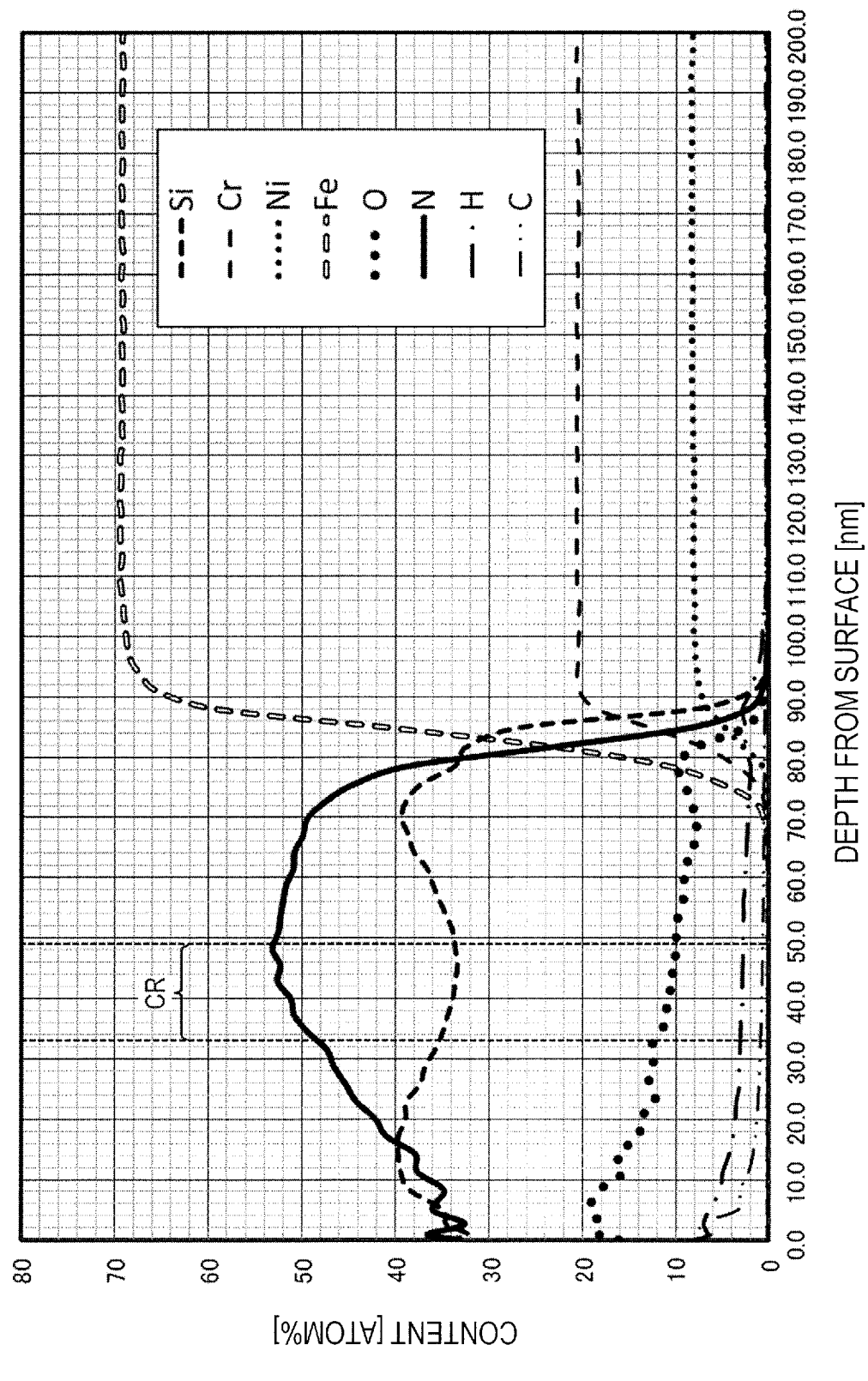
FIG. 7 is a graph for showing the results of composition analysis of a ceramic film of Example 4 performed by an X-ray photoelectron spectroscopy (XPS) method.

The results of the composition analysis performed by the XPS method are shown in Table 5 and FIG. 7.

TABLE 5

Example 4

| Depth from surface [nm] | Content [atom %] | | | | | | | |
|---|---|---|---|---|---|---|---|---|
| | Si | O | N | H | Cr | Ni | Fe | C |
| 0.0 | 34.2 | 16.1 | 33.3 | 7.4 | 0.0 | 0.0 | 0.0 | 8.6 |
| 0.9 | 32.2 | 18.2 | 36.6 | 6.6 | 0.0 | 0.0 | 0.0 | 6.2 |
| 2.6 | 34.6 | 17.9 | 32.6 | 7.0 | 0.0 | 0.0 | 0.0 | 7.6 |
| 4.9 | 34.8 | 19.3 | 36.0 | 6.4 | 0.0 | 0.0 | 0.0 | 3.4 |
| 8.2 | 38.5 | 18.2 | 34.8 | 5.2 | 0.0 | 0.0 | 0.0 | 3.1 |
| 11.2 | 39.4 | 15.6 | 37.7 | 5.0 | 0.0 | 0.0 | 0.0 | 2.2 |
| 14.2 | 39.7 | 16.3 | 37.9 | 4.3 | 0.0 | 0.0 | 0.0 | 1.7 |
| 17.1 | 39.7 | 13.9 | 41.0 | 3.9 | 0.0 | 0.0 | 0.0 | 1.4 |
| 20.0 | 38.9 | 13.9 | 42.2 | 3.6 | 0.0 | 0.0 | 0.0 | 1.3 |
| 22.9 | 38.9 | 12.2 | 44.2 | 3.5 | 0.0 | 0.0 | 0.0 | 1.2 |
| 25.8 | 37.4 | 13.0 | 45.4 | 3.2 | 0.0 | 0.0 | 0.0 | 1.1 |
| 28.6 | 36.9 | 12.3 | 46.6 | 3.2 | 0.0 | 0.0 | 0.0 | 1.0 |
| 31.5 | 35.7 | 12.8 | 47.4 | 3.1 | 0.0 | 0.0 | 0.0 | 0.9 |
| 34.3 | 35.0 | 11.7 | 49.3 | 3.1 | 0.0 | 0.0 | 0.0 | 0.9 |
| 37.1 | 34.5 | 10.8 | 50.9 | 3.0 | 0.0 | 0.0 | 0.0 | 0.8 |
| 39.9 | 33.9 | 11.2 | 51.2 | 2.8 | 0.0 | 0.0 | 0.0 | 0.8 |
| 42.7 | 33.6 | 10.0 | 52.6 | 2.9 | 0.0 | 0.0 | 0.0 | 0.7 |
| 45.4 | 33.4 | 10.7 | 52.3 | 2.8 | 0.0 | 0.0 | 0.0 | 0.7 |
| 48.1 | 33.6 | 9.7 | 53.2 | 2.8 | 0.0 | 0.0 | 0.0 | 0.7 |
| 50.8 | 33.8 | 10.1 | 52.6 | 2.8 | 0.0 | 0.0 | 0.0 | 0.6 |
| 53.5 | 34.5 | 9.8 | 52.3 | 2.7 | 0.0 | 0.0 | 0.0 | 0.6 |
| 56.2 | 35.3 | 9.2 | 52.0 | 2.7 | 0.0 | 0.0 | 0.0 | 0.6 |
| 58.9 | 36.0 | 9.0 | 51.7 | 2.6 | 0.0 | 0.0 | 0.0 | 0.6 |
| 61.6 | 36.7 | 9.3 | 50.9 | 2.5 | 0.0 | 0.0 | 0.0 | 0.5 |
| 64.3 | 38.1 | 7.9 | 50.8 | 2.4 | 0.0 | 0.0 | 0.0 | 0.5 |
| 66.9 | 38.6 | 8.3 | 49.9 | 2.4 | 0.1 | 0.0 | 0.2 | 0.5 |
| 69.7 | 39.4 | 7.5 | 49.5 | 2.3 | 0.2 | 0.0 | 0.5 | 0.6 |
| 72.5 | 38.9 | 8.6 | 47.5 | 2.2 | 0.5 | 0.1 | 1.5 | 0.6 |
| 75.4 | 37.3 | 8.9 | 44.5 | 2.1 | 1.2 | 0.2 | 5.0 | 0.5 |
| 78.5 | 33.7 | 9.8 | 38.6 | 2.0 | 3.5 | 0.7 | 10.9 | 0.4 |
| 81.7 | 32.4 | 7.8 | 22.9 | 2.5 | 7.2 | 2.8 | 23.3 | 0.5 |
| 84.8 | 26.8 | 2.6 | 8.4 | 2.5 | 12.8 | 4.7 | 40.8 | 0.5 |
| 87.9 | 7.9 | 1.1 | 2.2 | 2.9 | 18.6 | 6.6 | 59.3 | 0.4 |

In the ceramic film 20 of Example 4, the central region CR is a region at depths of from 32.8 nm to 49.2 nm from the surface. As apparent from Table 5 and FIG. 7, the central region CR has a hydrogen content of 2 atom % or more.

As apparent from the testing results for Examples 3 and 4, in the ceramic film 20 having satisfactory film quality, the central region CR had a hydrogen content of 2 atom % or more. Thus, it is found that, when the water vapor partial pressure of the atmosphere during the sputtering step is $1.5\times10^{-3}$ Pa or less and the hydrogen content of the central region CR of the ceramic film 20 is 2 atom % or more, the film quality of the ceramic film 20 is improved.

The hydrogen content of the central region CR is preferably 20 atom % or less. It has been confirmed by testing performed by the inventors of the preferred embodiments of the present invention that, when the hydrogen content is excessively high, there is a risk in that the water resistance of the ceramic film 20 may be reduced.

In addition, in the ceramic film 20 of each of Examples 3 and 4, the oxygen content of the central region CR is 3 atom % or more and 20 atom % or less, the nitrogen content of the central region CR is 20 atom % or more and 60 atom % or less, and the silicon content of the central region CR is 20 atom % or more and 50 atom % or less. Therefore, from the viewpoint of obtaining satisfactory film quality, it is preferred that the oxygen content, nitrogen content, and silicon content of the central region CR be 3 atom % or more and 20 atom % or less, 20 atom % or more and 60 atom % or less, and 20 atom % or more and 50 atom % or less, respectively.

In Examples 3 and 4, the set film thickness in the film formation may be the film thickness of the ceramic film 20, but the film thickness of the ceramic film 20 may also be identified from the results of the composition analysis shown in FIG. 6 and FIG. 7. For example, in the example of FIG. 6, the composition greatly changes at around a depth of 20 nm from the surface, and hence this portion may be presumed to be the surface of the substrate 10. In addition, in the example of FIG. 7, the composition gradually changes at around depths of from 70 nm to 90 nm from the surface, and hence the center of this region (composition transition region) at around 80 nm may be presumed to be the surface of the substrate 10.

As described above, when the ceramic film 20 needs to be substantially colorless and substantially transparent (e.g., when the ceramic film 20 is used for an optical film or the like), the thickness of the ceramic film 20 is set to, for example, 5 nm or more and 30 nm or less (preferably 10 nm or more and 20 nm or less).

In Table 6, the results of measurement of total light transmittances are shown for a case in which a silicon oxynitride film having a thickness of 20 nm was formed as the ceramic film 20 on the surface of the colorless and transparent substrate 10 (substrate film) and a case in which the silicon oxynitride film was not formed.

TABLE 6

| Substrate film | Thickness of substrate film [μm] | Thickness of SiOxNy film [nm] | Total light transmittance [%] | |
|---|---|---|---|---|
| | | | Substrate film alone | With SiOxNy film |
| PET | 50 | 20 | 89.0 | 88.9 |
| PEN | 50 | 20 | 85.1 | 85.1 |

As shown in Table 6, in both the case where the material for the substrate film was PET and the case where the material was PEN, there was almost no difference between the total light transmittance of the substrate film alone and the total light transmittance of the substrate film having the silicon oxynitride film formed on its surface. Thus, the silicon oxynitride film is substantially colorless and substantially transparent.

According to preferred embodiments of the present invention, a film-forming method that improves the film quality of a silicon-containing ceramic film is provided. The film-forming method according to the preferred embodiments of the present invention may be suitably used in production methods for various products with ceramic films.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A film-forming method comprising:
   sputtering a silicon oxynitride film on a surface of a substrate using a silicon-containing target as a target, the target supplied with input power from a DC power source or a DC pulse power source, and at least a nitrogen gas as a reactive gas; wherein
   the sputtering of the silicon oxynitride film is performed in an atmosphere having a water vapor partial pressure of about $1.0 \times 10^{-5}$ Pa or more and about $1.5 \times 10^{-3}$ Pa or less;
   a central region of the silicon oxynitride film formed during the sputtering has a hydrogen content of about 9 atom % or more and about 20 atom % or less;
   the central region collectively refers to a region extending from a center of the silicon oxynitride film in a film thickness direction toward a front surface of the silicon oxynitride film for about 10% of the film thickness and a region extending from the center of the silicon oxynitride film in the film thickness direction toward a back surface of the silicon oxynitride film for about 10% of the film thickness; and
   a depth of the silicon oxynitride film that is formed during the sputtering and that is adjacent to the front surface of the silicon oxynitride film has a hydrogen content higher than the hydrogen content of the central region.

2. The film-forming method according to claim 1, wherein the central region has an oxygen content of about 3 atom % or more and about 20 atom % or less.

3. The film-forming method according to claim 1, wherein the central region has a nitrogen content of about 20 atom % or more and about 60 atom % or less.

4. The film-forming method according to claim 1, wherein the central region has a silicon content of about 20 atom % or more and about 50 atom % or less.

5. The film-forming method according to claim 1, wherein the substrate has a temperature of about 100° C. or less during the sputtering of the silicon oxynitride film.

6. The film-forming method according to claim 1, wherein the substrate has a temperature of about 80° C. or less during the sputtering of the silicon oxynitride film.

7. The film-forming method according to claim 1, wherein the substrate has a temperature of about 60° C. or less during the sputtering of the silicon oxynitride film.

8. The film-forming method according to claim 1, wherein the water vapor partial pressure of the atmosphere during the sputtering of the silicon oxynitride film is about $1.0 \times 10^{-5}$ Pa or more and about $1.0 \times 10^{-3}$ Pa or less.

9. The film-forming method according to claim 1, wherein the atmosphere during the sputtering of the silicon oxynitride film has a total pressure of about $3.0 \times 10^{-2}$ Pa or more and about 1.0 Pa or less.

10. The film-forming method according to claim 1, wherein a ratio of the water vapor partial pressure to a total pressure of the atmosphere during the sputtering of the silicon oxynitride film is about 0.02 or less.

11. The film-forming method according to claim 1, wherein a ratio of the water vapor partial pressure to a total pressure of the atmosphere during the sputtering of the silicon oxynitride film is about 0.01 or less.

12. The film-forming method according to claim 1, wherein an input power density during the sputtering of the silicon oxynitride film, which is input power per unit area supplied to the target, is about 1.0 W/cm$^2$ or more.

13. The film-forming method according to claim 12, wherein the input power density during the sputtering of the silicon oxynitride film is about 2.0 W/cm$^2$ or more.

14. The film-forming method according to claim 1, wherein
- the silicon oxynitride film has a thickness of about 5 nm or more and about 30 nm or less; and
- the silicon oxynitride film is substantially colorless and substantially transparent.

15. The film-forming method according to claim 14, wherein the thickness of the silicon oxynitride film is about 10 nm or more and about 20 nm or less.

16. A production method for a product with a ceramic film, the method comprising:
- preparing a substrate; and
- forming a silicon oxynitride film on a surface of the substrate as a ceramic film by the film-forming method according to claim 1.

17. A product including a ceramic film of the silicon oxynitride produced by the production method according to claim 16.

* * * * *